US008296702B2

(12) United States Patent
Mukherjee

(10) Patent No.: US 8,296,702 B2
(45) Date of Patent: Oct. 23, 2012

(54) RECTILINEAR COVERING METHOD WITH BOUNDED NUMBER OF RECTANGLES FOR DESIGNING A VLSI CHIP

(75) Inventor: Maharaj Mukherjee, Hopewell Jct., NY (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 12/686,412

(22) Filed: Jan. 13, 2010

(65) Prior Publication Data

US 2011/0173579 A1 Jul. 14, 2011

(51) Int. Cl.
G06F 17/50 (2006.01)
(52) U.S. Cl. .......................................... 716/110; 716/50
(58) Field of Classification Search .................. 716/100, 716/110, 50
See application file for complete search history.

(56) References Cited

U.S. PATENT DOCUMENTS

| 5,675,720 A * | 10/1997 | Sato et al. ...................... 345/419 |
| 5,943,056 A * | 8/1999 | Sato et al. ...................... 345/419 |
| 6,532,578 B2 | 3/2003 | Chakraborty et al. |
| 7,030,875 B2 * | 4/2006 | Gupta et al. ................... 345/419 |
| 7,185,023 B2 * | 2/2007 | Kothuri .................................. 1/1 |
| 2005/0202326 A1 | 9/2005 | Gordon et al. |
| 2008/0059929 A1 * | 3/2008 | Papadopoulou et al. ......... 716/5 |
| 2012/0047098 A1 * | 2/2012 | Reem ............................... 706/12 |

OTHER PUBLICATIONS

Mukherjee, et al. "The Problem of Optimal Placement of Sub-Resolution Assist Features (SRAF)" Optical Microlithography XVIII, Proceedings of SPIE vol. 5754 pp. 1417-1429.
Mukherjee, et al. "A Polynomial-time Optimization Algorithm for a Rectilinear Partitioning Problem With Applications in VLSI Design Automation" Information Processing Letters 83 (2002) 41-48.
Chakraborty, et al.; "Novel Algorithms for Placement of Rectangular Covers for Mask Inspection in Advanced Lithography and Other VLSI Design Applications", 2006 IEEE Transactions on Computer-Aided Design of Integrated Circuits and Systems, vol. 25, No. 1, Jan. 2006 pp. 79-91.

\* cited by examiner

*Primary Examiner* — Suchin Parihar
(74) *Attorney, Agent, or Firm* — H. Daniel Schnurmann

(57) ABSTRACT

A method for creating a rectilinear non-convex polygonal output representative of a component used to build a VLSI circuit chip from a plurality of points corresponding to a plurality of components of the chip includes: covering the plurality of points with a set of rectangles; creating a Voronoi diagram for the set of rectangles; forming a nearest neighbor tree for the Voronoi diagram; connecting a selected set of the rectangles corresponding to the nearest neighbor tree into a non-convex rectilinear polygon; and applying the non-convex rectilinear polygon to build the VLSI chip.

19 Claims, 14 Drawing Sheets

RECTILINEAR COVERING METHOD WITH BOUNDED NUMBER OF RECTANGLES FOR DESIGNING A VLSI CHIP

FIELD OF THE INVENTION

The present invention relates to the design and manufacturing of Very Large Scale Integrated chips and, more particularly, to a method of configuring partitions for locating different circuits or other operational areas of the chip.

BACKGROUND AND RELATED ART

Very Large Scale Integrated (VLSI) chips include many electronic components (e.g., transistors, resistors, diodes, and the like) interconnected to form multiple circuit components (e.g., gates, cells, memory units, arithmetic units, controllers, decoders, and the like). The electronic and circuit components of the VLSI chip are jointly referred to as "components."

A conventional VLSI circuit includes multiple layers of wiring (wiring layers) that interconnect the electronic and circuit components. For instance, VLSI chips are fabricated with metal or polysilicon wiring layers (collectively referred hereinafter as metal layers) that interconnect the electronic and circuit components. Common fabrication models use five or more metal layers. Wiring in each metal layer is laid out in a rectilinear or orthogonal manner so that each wire segment is parallel to either the X or Y axis.

Design engineers design VLSI chips by transforming the circuit description of the VLSI circuits into a geometric representation, referred to as layout using electronic design automation (EDA) applications. These applications provide sets of computer based tools for creating, editing, and analyzing the integrated circuit (IC) design layouts.

The layouts are created using geometric shapes representing different materials and devices of the ICs. For instance, EDA tools commonly use rectangular lines to represent wire segments interconnecting the IC components. The tools handle electronic and IC components as geometric objects of varying shapes and sizes. For sake of simplicity, geometric objects will henceforth be shown as rectangular blocks. A "circuit module" refers to the geometric representation of the electronic or IC components. Generally, the EDA applications designs typically handle circuit modules having pins on their sides, the pins making the necessary connections to the interconnect lines.

A net defines a collection of pins that need to be electrically connected. A list or subset of all the layout nets is referred to as a netlist. Thus, a netlist specifies a group of nets which, in turn, specifies the interconnections between the pins.

FIG. 1 is an illustrative example of a conventional IC layout 100. As shown, the layout includes five circuit modules 105, 110, 115, 120, and 125 with pins 130-160. Four interconnect lines 165-180 connect the modules to their pins. Additionally, three nets specify the interconnections between the pins. Pins 135, 145, and 160 define a three-pin net, while pins 130 and 155 and pins 140 and 150, respectively, and define a pair of two pin nets. As shown in FIG. 1, the circuit module (e.g., 105) can be provided with a plurality of pins of multiple nets.

The IC design process entails various operations. Some of the physical-design operations that EDA applications used to create IC layouts include: (1) circuit partitioning, which partitions a circuit if the circuit is too large for a single chip; (2) floor planning, that finds the alignment and relative orientation of the circuit modules; (3) placement, that determines more precisely the positions of the circuit modules; (4) routing, which completes the interconnects between the circuit modules; (5) compaction, which compresses the layout to decrease the total IC area; and (6) verification, which checks the layout to ensure that it meets design and functional requirements.

Routing is an essential operation of the physical design cycle. It is generally divided into two phases: global routing and detailed routing. For each net, global routing generates a "loose" route (also referred to as path or routing area) for the interconnect lines connecting the pins of the net. The "looseness" of the global route depends on a particular global router used. After creating the global routes, the detailed routing creates specific individual routing paths for each net.

Design automation of complex VLSI chips is often associated to a lengthy design turnaround time which, in turn, increases the time-to-market introduction. Two reasons for the large turnaround time problem include: slowness of the algorithms caused by large problem sizes (e.g., hundreds of millions of circuits and nets on a chip), and the large number of iterations between different algorithms requiring convergence to an acceptable level.

Current design tools are presently reaching the limit of their efficiency and speed as the number of circuit components such as transistors, diodes, capacitors, resistors, and the like, increase exponentially, and the complexity of their connectivity increases geometrically in term of the number of components.

A conventional approach towards improving the speed of VLSI design-automation algorithms is known as partitioning. Partitioning helps developers of the VLSI design automation tools to optimize the design parameters within each partition locally. Circuit netlists can be modeled as hypergraphs partitioned using various heuristics that are known to give good results, both in terms of runtime and quality of results.

In the geometric design of the VLSI chip, it is customary to represent circuit components such as terminals, connector corners and vias as a set of points in the X-Y plane. An example of the set of points is shown in FIG. 2A. Numeral 201 illustrates a terminal, and 200, a collection of points. The point set representation of geometric circuits allows the tool developer to concentrate on the underlying geometric relationship among different components rather than their synthetic connectivity relationship as determined by the circuit designer. An example of a net based on the points of FIG. 2A is referenced in FIG. 2B by numeral 210, consisting of 34 smaller rectangles, such as 215.

A major critical issue for any type of partitioning in the development of VLSI design automation algorithm is directed to the chip real estate. Since the number of components is very large and the space they occupy is always at a premium, it becomes necessary to minimize the total area of the partitions. Normally, there exists an upper bound on the number of such partitions that can be used to solve a particular problem since, as the number of partitions increases, the complexity of the algorithm(s) increases with it. The number of partitions may be determined by the designer on the basis of design constraints.

The conventional optical microlithography process in semiconductor fabrication, also known as the photolithography process, includes duplicating desired circuit patterns onto semiconductor wafers for an overall desired circuit performance. The desired circuit patterns can be represented as opaque, complete and semi-transparent regions on a template commonly referred to as a photomask. In an optical microlithography, patterns on the photomask template are projected onto a photoresist coated wafer by way of optical imaging through an exposure system.

The continuous advancement of VLSI chip manufacturing technology to meet Moore's law of shrinking device dimensions in a geometric progression has spurred the development of Resolution Enhancement Techniques (RET) and Optical Proximity Correction (OPC) methodologies in the optical microlithography. The latter is the method of choice for chip manufacturers for the foreseeable future due to its high volume yield in manufacturing and past history of success. However, the ever shrinking device dimensions combined with the desire to enhance circuit performance in the deep sub-wavelength domain require complex OPC methodologies to ensure the fidelity of mask patterns of the printed wafer.

In spite of significant advances in several forms of RET, the iterative Model-Based Optical Proximity Correction (MBOPC) has established itself as the method of choice for compensating the mask shapes for lithographic process effects. Conventional MBOPC tools include shapes on the mask design (henceforth referred to as the mask) typically defined as polygons. A pre-processing step is performed by dividing the edges of each mask shape into smaller line segments. At the heart of the MBOPC tool is a simulator that simulates the image intensity at a particular point, which is located at the center of each line segment. The segments are then moved back and forth, i.e., outwardly or inwardly from the feature interior from their original position on the mask shape at each iteration step of the MBOPC. The iteration stops as a result of the modification of the mask shapes when the image intensity at the pre-selected points matches a threshold intensity level within a tolerance limit.

While the quality of the OPC may improve as the number of segments increases, the efficiency of the MBOPC tool may decrease as the number of segments it simulates and iterates over in each iterative step increases. The number of segments, in turn, depends on the number of edges in each mask shape. Therefore, it is desirable that segments that are corrected are only those that are needed to obtain the desired lithographic quality.

While the model based OPC can be described as an optimization of mask shapes, another method known as source optimization is directed to optimizing the shape of the source pixels to improve the fidelity of the wafer shapes. The combined effect of the source and the mask optimization of the MBOPC is also known as the Source Mask Optimization (SMO).

SMO stems from the fact that light from different pixels of the source travels different distances to the wafer through the mask. The difference in traveled distances causes a phase difference in the beams of light emanating from different pixels. Differences in the phases determine how light beams interact at the wafer and mask levels. In case of constructive interferences, the light beams strengthen each other and strengthens the total effect of the light. In case of destructive interferences, the light beams weaken each other and weaken the total effect of the light. The object of SMO resides in determining the light pixels requiring to be turned on, such that the constructive interferences strengthen the effect of light where there is a need to have light on the wafer, and destructive interferences weaken the effect of light where no light is to be present thereon.

An example of a source after optimization is shown in FIG. 3 by way of numeral 300. A turned on pixel 301 is illustrated. The example illustrates only a limited number of pixels. A solution of source optimization with higher granularity of pixels is depicted in FIG. 3 by numeral 310.

Notwithstanding the above, it is still difficult and costly to construct a pixilated source as illustrated by, e.g. 301 and 310 (FIG. 3). An approximation of the source optimization is created by placing a filter in front of the source that approximates the 'on pixels'. The requirement of such an approximation is that the solution pixels need to be contained within a rectilinear polygon.

The ever increasing cost of mask manufacturing and inspection and the ever increasing complexity of OPC and RET requires that the mask be correctly and accurately simulated for potential defects before the mask is manufactured. The area is generally known as Mask Manufacturability Verification or Optical Rule Checking (ORC), for which an accurate simulation is a primary concern of the ORC. This implies that the ORC simulation should not miss any real error on the mask. The cost of finding an error when the mask is actually manufactured and used for chip manufacturing is very high. Nevertheless, there are two other equally important objectives of a ORC tool. First, it needs to be done as rapidly as possible. The feedback from ORC is used for the development of OPC and RET. A fast feedback is useful to minimize the turn around time of the OPC and RET developments. Additionally, the number of few false errors should be minimized as much possible. A false error is defined as an error identified by ORC using the simulation tool, which does not happen on the wafer. Since a missed error is significantly more expensive than a false error, all the ORC tools are expected to err on the conservative side. However, since each error whether false or real needs to be checked manually, it is important that the number of false errors be minimized. If there are too many, the real errors may be missed by the manual inspection, requiring a significant amount of time to shift through all the false errors to find the real errors.

Current ORC methods tend to simulate the entire mask layout image with the most accurate geometry using conservative criteria and, further, and which have a tendency of increasing the runtime of the ORC along with the number of false errors.

The aforementioned methodology is illustrated in FIG. 4A. The input to the current art is one or more input mask layouts 401 created after application of one or more RET or OPC. Along with it, a target wafer image 400 is also provided as an input. In step 402, all the target and mask shapes are subdivided into segments. In step 403, a correspondence is established between each mask segment and one target shape. Next, in step 404, each mask segment is simulated using a calibrated resist and optical model. The simulated wafer segment is then compared against the corresponding target segment 405. If the simulated wafer segment is not contained within the tolerance of the corresponding target segment, it is reported as an error 407.

The proper functioning of a chip requires strong tolerance on the printability of a wafer image. Any deviation of such tolerance are classified as an error. This is demonstrated in FIG. 4B, wherein 451 and 452 are mask layout shapes, 451 are the main mask shapes, and 452 are examples of Sub-Resolution Assist Features (SRAF) which do not print themselves but help in printing the main mask shapes 451. The printed wafer image is shown as shaded shapes 455. Various kinds of errors are further illustrated in the image including:

461 depicts a "Necking Error", where the wafer image width becomes smaller than a pre-determined value;

462 depicts a "Bridging Error", where spacing between two wafer images becomes smaller than a predetermined value;

463 depicts an "Edge Placement Error", where the wafer image edge is further away than the target edge of 451 by a predetermined value;

464 depicts an "Line End Shortening Error", where the wafer image edge at a line end is further away than the target line-end edge of 451 by a predetermined value;

465 depicts an SRAF printing error, where a portion of the SRAF prints, even though SRAFs are not expected to be printed; and 466 depicts additional printing errors due to diffraction effects of lighting such as side lobe printing error.

Errors are often shown as points or small rectangles on the mask, as shown in FIG. 4B, which illustrates two kinds of errors, depicted as point sets 411 and 412. Next, ORC localizes one type of errors within the cluster, bounding one group of errors within a bounding box, such as 415 (FIG. 4C) for group error 411. However, the bounding box does not show a very tight bound. Indeed, group of errors 411 includes the errors of group 412. This requires having a tighter bound on one set of errors that includes all the errors of the selected group, but which does not yet encounter too many other kinds of errors that can be simply described by a rectilinear polygon with a bounded number of edges.

In view of the aforementioned considerations, it is necessary to provide in industry a method for finding a rectilinear polygon containing a set of input points, the input points being either a set of points to be clustered as a netlist, or a set of pixilated source points, or a set of ORC errors. The rectilinear polygon needs to have a small area and at the same time it requires to be bounded by a limited number of edges. This requirement can also be defined by requiring that the rectilinear polygon be covered by a maximum k number of rectangles, where k is a user provided value.

SUMMARY

In one aspect of the invention, routing a VLSI design layout includes minimizing the area of the metal layer, minimizing the total real estate. The number of bounded rectangles increases the manufacturability through Design for Manufacturability (DFM) and Optical Proximity Correction (OPC) and reduces the number of corners to improve the OPC.

In another aspect of the invention, a set of n points is provided, with k being the uppermost bound on the number of rectangles. The object is to find p=ceil(k/2) rectangles that cover the n points, This is preferably accomplished by creating a Voronoi diagram for the p rectangles, followed by creating a Nearest Neighbor Tree based on the Voronoi diagram, and finally, by connecting the Nearest Neighbor rectangles to create a rectilinear polygon.

In still another aspect, the invention provides a method wherein input points are covered by a rectilinear polygon with the smallest area, and wherein the polygon ends covered by a maximum number of rectangles, the rectangles operating as an input parameter.

In yet another aspect of the present invention, the netlist for a given set of input terminals is represented by a set of input points, wherein the ensuing a rectilinear polygon is simple for further processing, e.g., by Optical Proximity Correction (OPC). The present invention also creates a tight bound for a group of pixilated source generated by a Source Mask Optimization (SMO) method, in which case, the output source pixels can be advantageously used as a set of input points, and having the tightly bound group of pixels forming a rectilinear polygonal source. The present invention further creates a tight bound for a group of errors generated by an ORC or Design Rules Checking method, using the output error locations as input points, the tight bound for the group of errors forming the rectilinear polygon.

In a further aspect, the invention provides a method and a system for creating a rectilinear non-convex polygonal output representation of a component used in building of a VLSI chip from a plurality of points, each of the points representing a plurality of components including: a) covering said plurality of points with a set of rectangles; b) creating a Voronoi diagram with a computer for said set of rectangles; c) forming a nearest neighbor tree for said Voronoi diagram; d) connecting a selected set of said rectangles corresponding to said nearest neighbor tree into a non-convex rectilinear polygon; and e) applying said non-convex rectilinear polygon to build said VLSI chip.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

DETAILED DESCRIPTION OF DETAILED EMBODIMENTS

In describing the preferred embodiment of the present invention, reference will be made in conjunction to FIGS. 5-15, wherein like numerals refer to like features.

Figure 5:
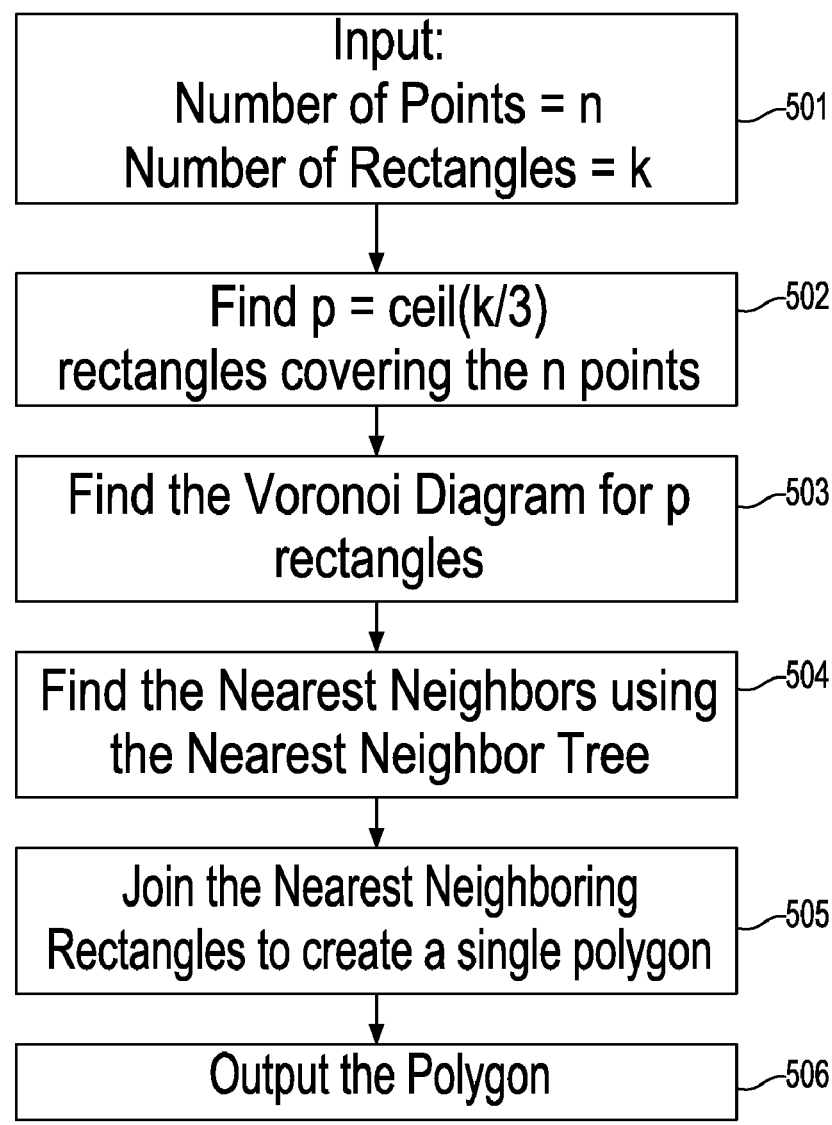
FIG. 5 is a flow chart in accordance to one embodiment of the present invention.

In accordance with one embodiment of the present invention, a flow chart is shown with reference to FIG. 5.

In step 501, a set of input points n is provided, the number of input points including terminals of the netlist. In another embodiment, the number of input points includes a pixilated source generated by an SMO program. In still another embodiment, the number of input points is shown to include the errors generated by ORC or DRC programs.

The maximum number of rectangles k is a parameter similar to the one provided in Step 501. The input parameter k defines the 'simplicity' of the output rectilinear polygon, wherein the output rectilinear polygon has the smallest area and the rectilinear polygon is covered by the maximum number k of rectangles.

In the next Step 502, the n input points are first covered by p rectangles, wherein $p=\text{ceiling}(k/3).$ The method of covering the set of input points by rectangles such that the total area of the rectangles is minimized is described in U.S. Pat. No. 6,532,578, herein incorporated by reference, wherein a method of configuring integrated circuits using a "greedy" algorithm for partitioning n points in p isothetic or orthogonal (i.e., parallel to X and Y axes) rectangles is described.

Figure 6A:
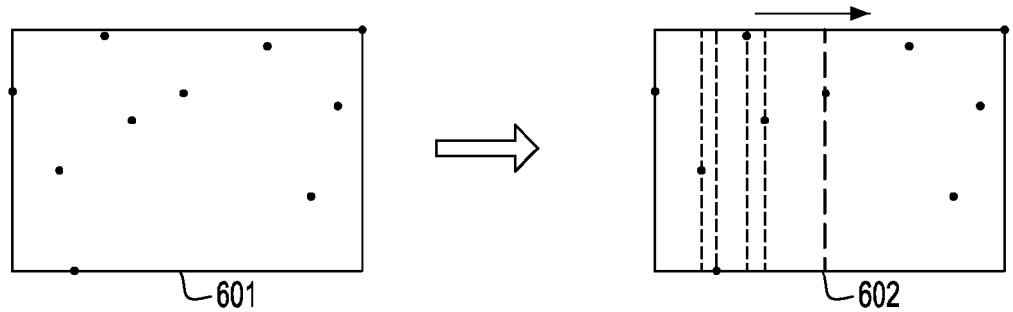
FIG. 6a is a schematic diagram of a group of ten points covered by four rectangles, in accordance with an embodiment of the invention, wherein two rectangles are created for each scan line.
Figure 6B:
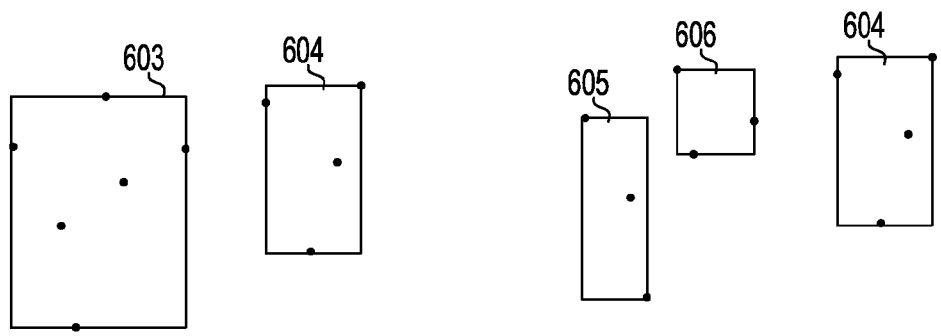
FIG. 6b shows a pair of rectangles with selected areas divided into three rectangles having the smallest area and followed by yet another rectangle being further subdivided.
Figure 6C:
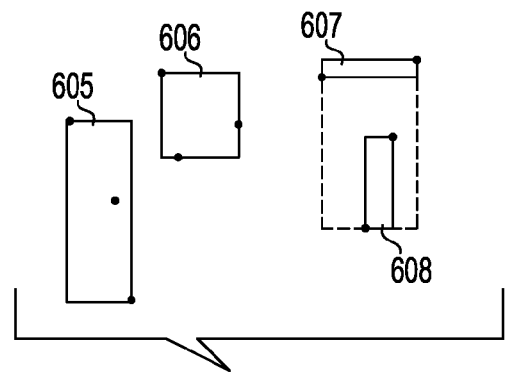
FIG. 6c illustrates another rectangle subdivided into two additional rectangles.

Referring now to FIGS. 6A through 6C, an embodiment of the present invention will now be described in more detail.

In FIG. 6A, a group of 10 (n=10) points 601 is shown that needs to be covered by p=4 rectangles. The points 602 are scanned horizontally and vertically. For each scan line, two rectangles are created, and a pair of rectangles with the smallest area 603 and 604 (FIG. 6B) is selected.

Still referring to FIG. 6B, rectangles 603 and 604 are further subdivided into three rectangles with the smallest area by the scan line algorithm. Rectangle 603 is illustrated being subdivided into 605 and 606, and rectangle 604 is subdivided into rectangles 607 and 608 (FIG. 6C). The final four rectangles depicted are 605, 606, 607, and 608 (FIG. 6C).

The p rectangles created in Step 502 are now to be connected to create the output rectilinear polygon. This is performed in steps 503, 504, and 505.

In step, 505, a Voronoi diagram is created for the set of p rectangles (Step 502). The method of creating a Voronoi diagram for a set of rectangles is described in U.S. Patent Application Publication No. 2005/0202326A1, incorporated herein by reference.

Figure 7:
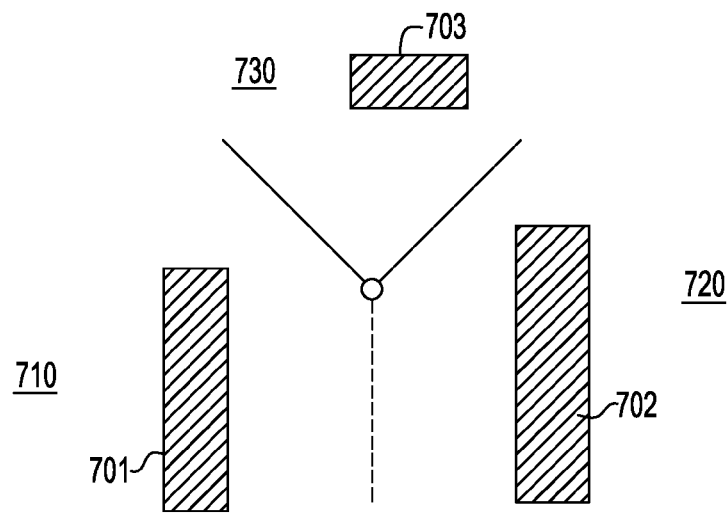
FIG. 7 shows a first Voronoi diagram for a set of rectangles defined as a tessellation of the 2-D space consisting of p regions.
Figure 8A:
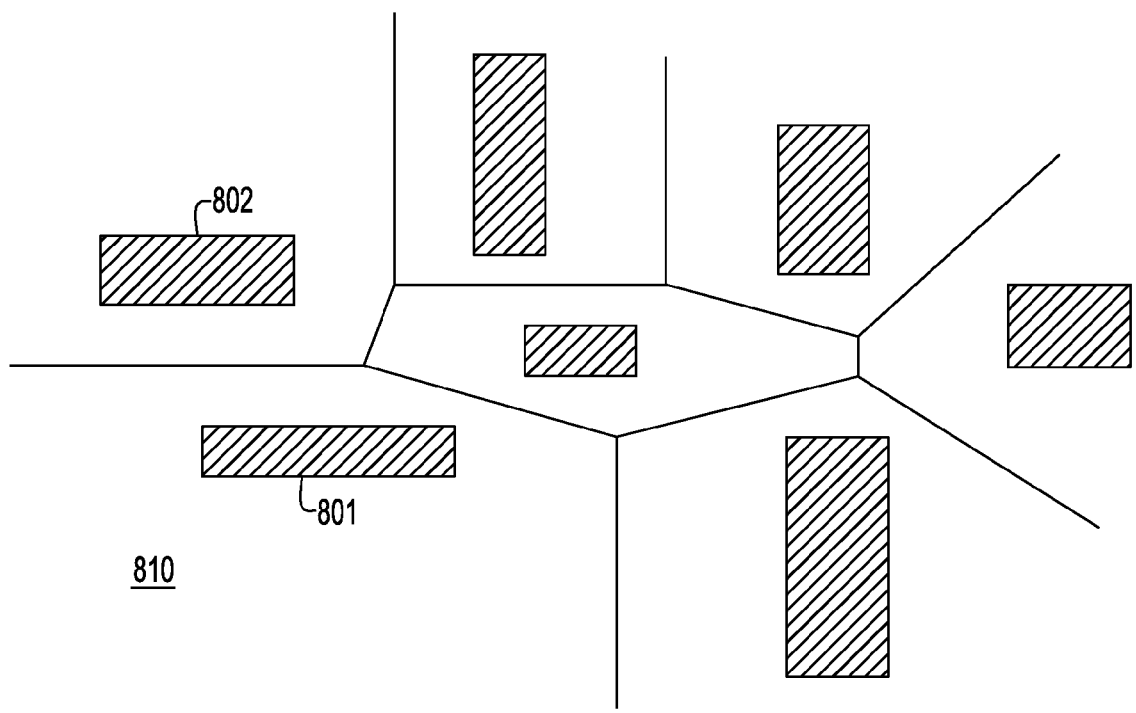
FIG. 8a shows a second example of a Voronoi diagram, with seven regions corresponding to seven rectangles.

Referring to FIGS. 7 and 8A, the Voronoi diagram for a set of rectangles will now be described. A set of p rectangles is defined as a tessellation of 2D space p regions so that any point within a region i is closer to rectangle i, for i=1, ..., p than any other rectangle j, where i is different from j, where j=1, ..., p.

In FIG. 7, a Voronoi diagram for three rectangles 701, 702, and 703 is shown. The corresponding Voronoi diagram shows the plane partitioned into three regions, viz., 710, 720 and 730. According to the definition of Voronoi diagram, any point within region 710 is closer to rectangle 701 than rectangles 702 and 703. Similarly, any point within region 720 is closer to rectangle 702 than rectangles 701 and 703.

Another example of a Voronoi diagram is illustrated in FIG. 8A showing seven regions corresponding to seven rectangles, wherein 801 is a rectangle and 810 within a corresponding Voronoi region.

Figure 8B:
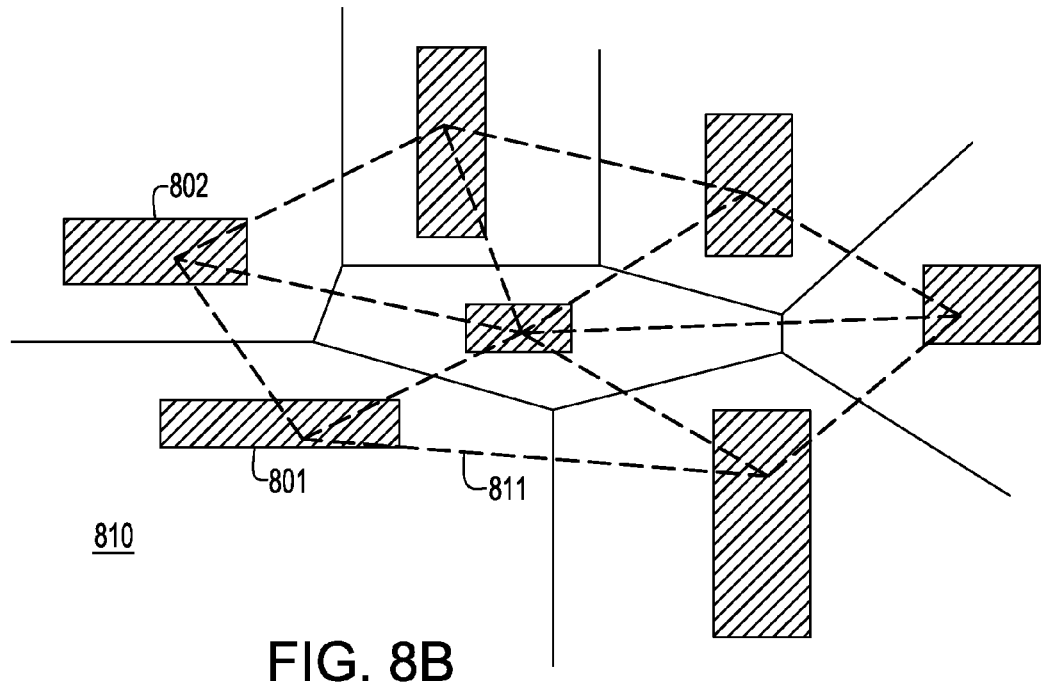
FIG. 8b shows a third Voronoi diagram for obtaining the nearest neighbor tree.

The Voronoi diagram obtained in step 503 (FIG. 5) is further used in Step 504 to obtain the nearest neighbor tree, the first step being the nearest neighbor graph shown in FIG. 8B. The nearest neighbor graph is a dual of the Voronoi diagram showing adjacent regions connected by an edge. An example of the nearest neighbor graph is shown by numeral 811 (FIG. 8B) corresponding to the Voronoi diagram of FIG. 8A.

The nearest neighbor graph is used to compute the nearest neighbor tree consisting of the Minimum Cost Spanning Tree of the Nearest Neighbor Graph, which is preferably obtained using Kruskal Minimum Cost Spanning Tree algorithm. Other Minimum Cost Spanning Tree algorithm can also be used with equal success.

In the step 505 (FIG. 5), the nearest neighbor tree created in step 504 is further used to join the p rectangles created in step 502.

Referring now to FIGS. 9A, 9B, 9C, and 9D, the rectangles are joined by having them extended, such that the rectangles that are connected by the branch of a nearest neighbor tree, as shown in FIG. 8B, are considered only for joining.

Figure 9A:
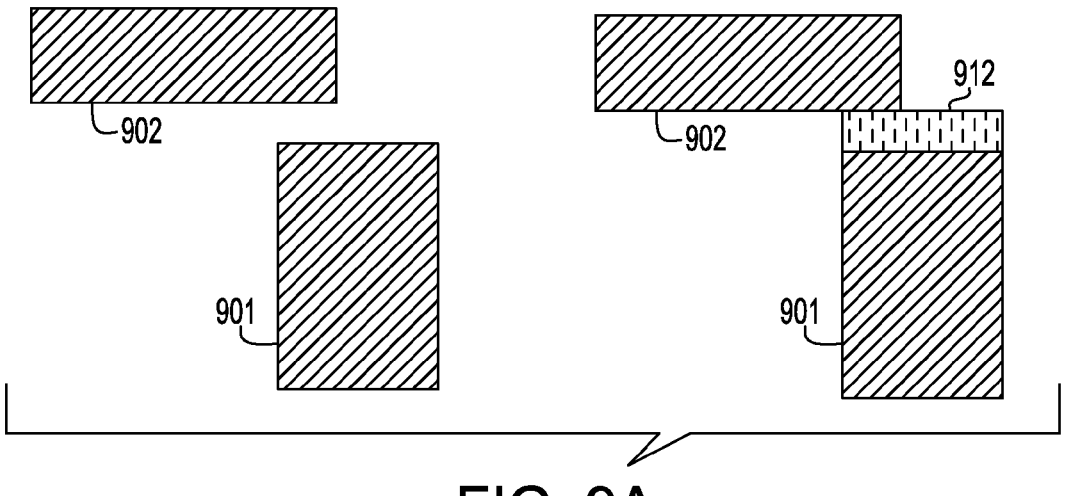
FIGS. 9a-9c show rectangles being joined by way of extension.

In FIG. 9A, two rectangles 901 and 902 are shown overlapping their x intervals. They can be joined by extending one of the rectangles along the y direction, as illustrated by numeral 912. Rectangle 901 is further extended to join with 903. Among the two rectangles that are to be joined, the one preferably to be extended is the one whose extension has the smallest area.

Figure 9B:
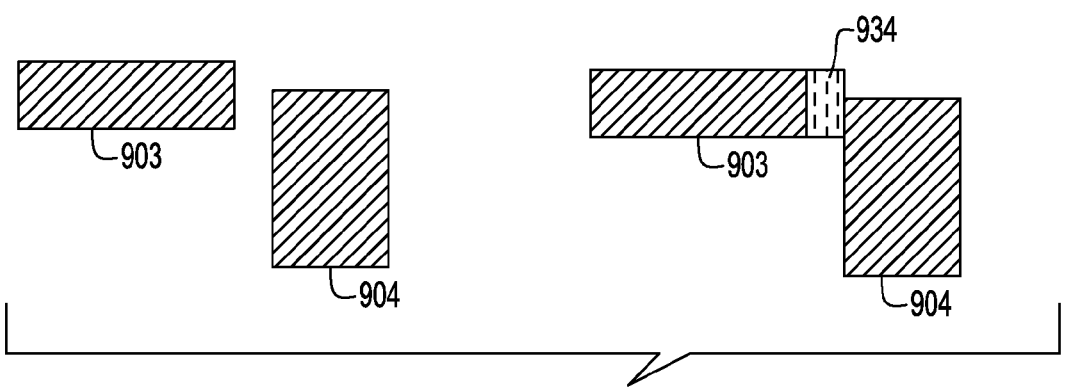

In FIG. 9B, two rectangles 903 and 904 are shown with overlap in their y intervals. They can be joined by extending one of the rectangles along the x direction, shown extended by numeral 934, wherein rectangle 903 is further extended to join with 904. Once again, of the two rectangles that are to be joined, the one preferably to be chosen is the one having an extension with the smallest area.

Figure 8C:
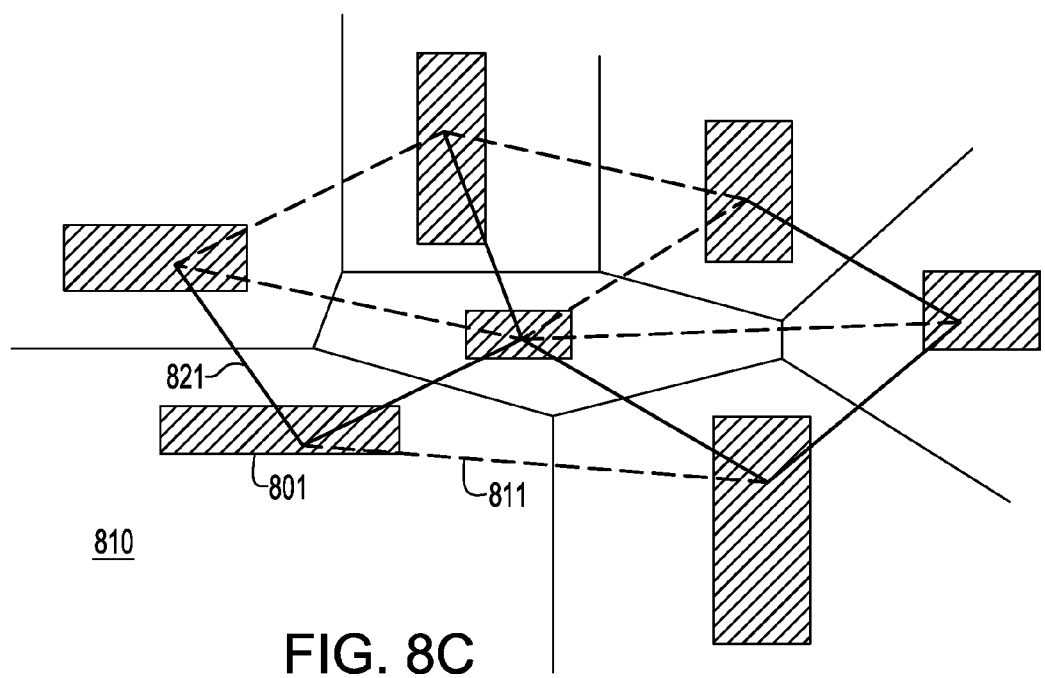
FIG. 8c shows rectangles connected by the branch of a nearest neighbor tree considered for joining.
Figure 9C:
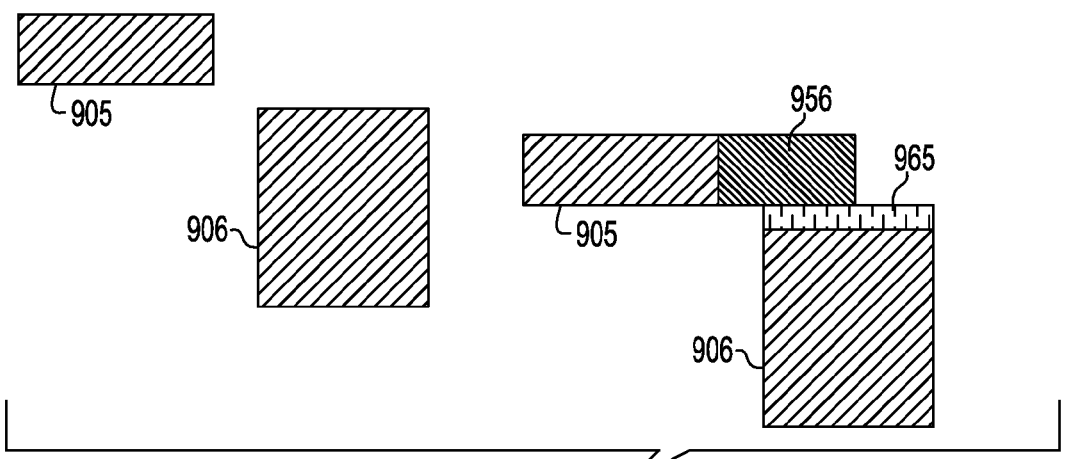

FIG. 9C shows an example of connecting rectangles for the set of rectangles shown in FIG. 8. In FIG. 9C, two rectangles 905 and 906 are shown with no overlap in either the x or y intervals (i.e., overlap along the x or y axes). Therefore, they can be joined by extending one of the rectangles in the x direction and another in the y direction. An example is shown by 956, wherein rectangle 905 is extended in the x direction by 965, and rectangle 906 is further extended in the y direction. Among the two rectangles to be joined, the one having the extension providing the smallest area is preferably selected.

Figure 9D:
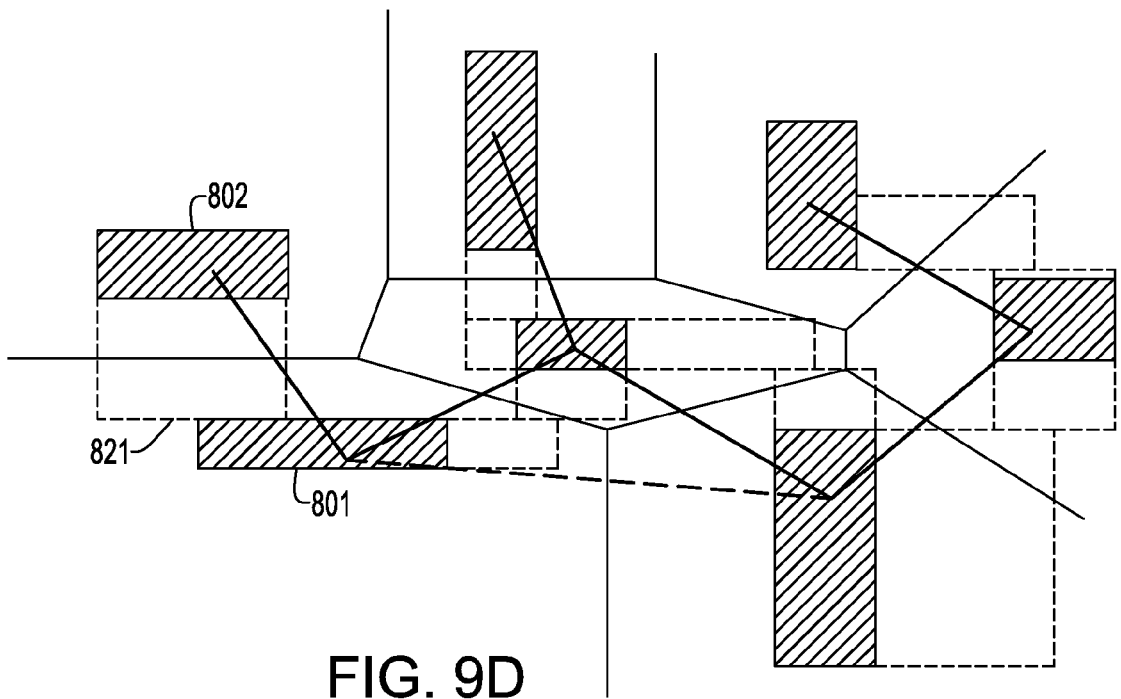
FIG. 9d illustrates an example of connecting rectangles for the set of rectangles shown in FIG. 8.

In FIG. 9D, for illustrative purposes, rectangle 821 is shown connecting rectangles 801 and 802.

The p rectangles that were created in step 502 are joined to their nearest neighbor tree to those created in step 505 (FIG. 5). The output is a rectilinear polygon that can be covered with k rectangles. The rectangle is then outputted in step 506 (FIG. 5).

Figure 10:
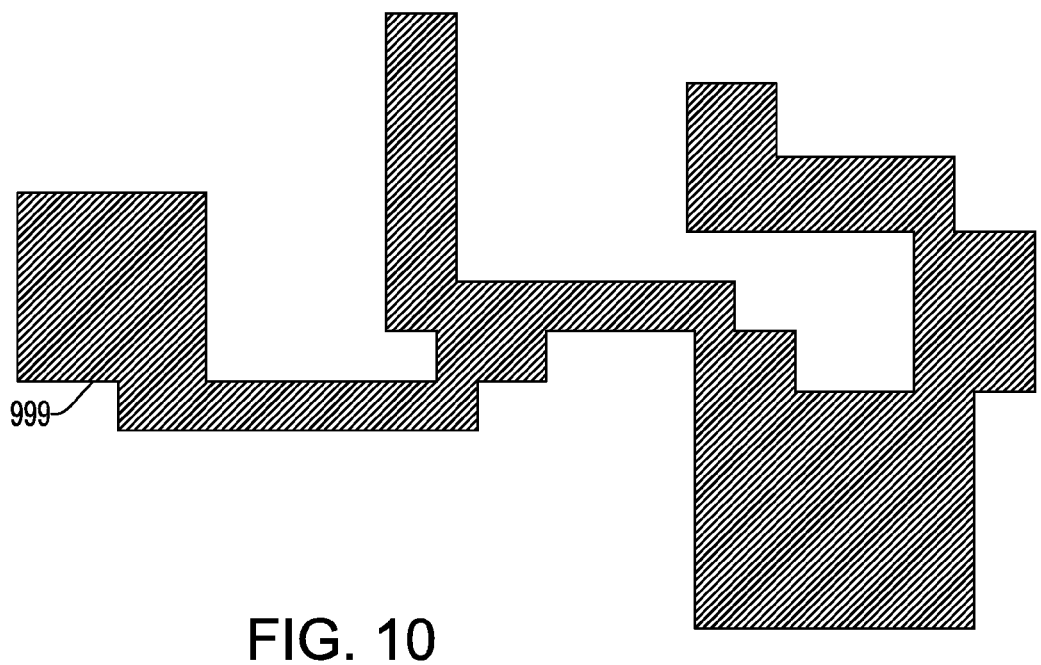
FIG. 10 shows a rectilinear polygon illustrating the final result to be outputted.

Rectilinear polygon 999 in FIG. 10 shows the final result to be outputted using the nearest neighbor graph and Voronoi diagram, in accordance with a preferred embodiment of the invention.

Figure 11:
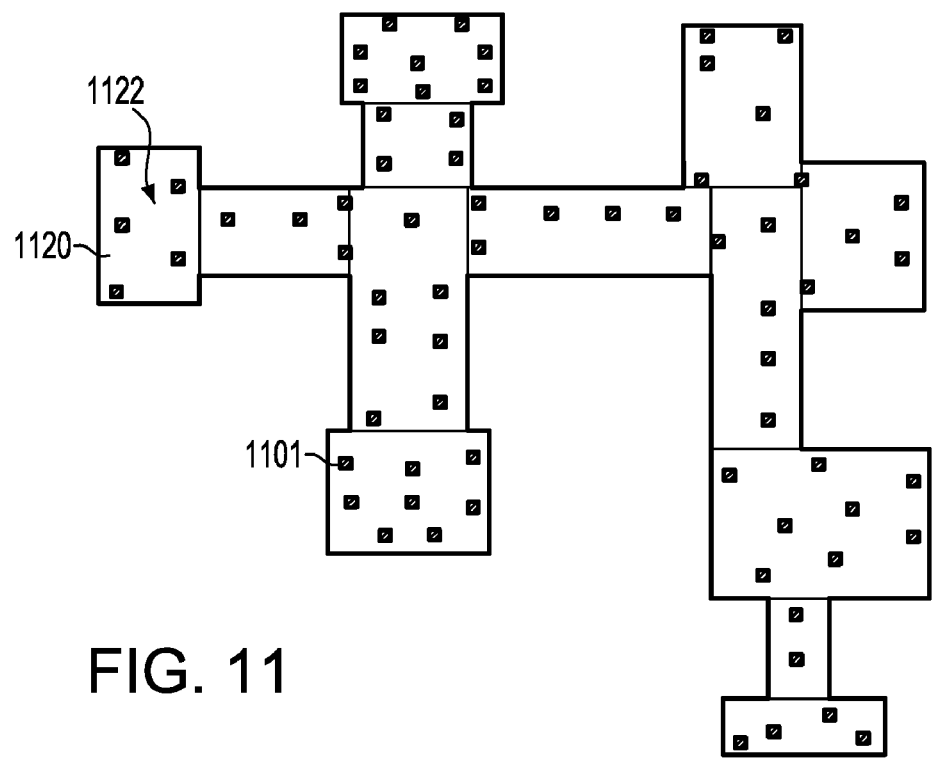
FIG. 11 shows an exemplary output of netlist consisting of ten smaller rectangles for a set of points, according to an embodiment of the present invention.

The output rectilinear polygon is the netlist for a given set of input terminal points. FIG. 11 shows an exemplary output of netlist 1122, according to an embodiment of the present invention for the set of points 1101. An example of a net with a limited number of rectangles is based on points 1101, referenced by numeral 1122, and shown consisting of ten smaller rectangles, e.g., 1120.

Figure 12:
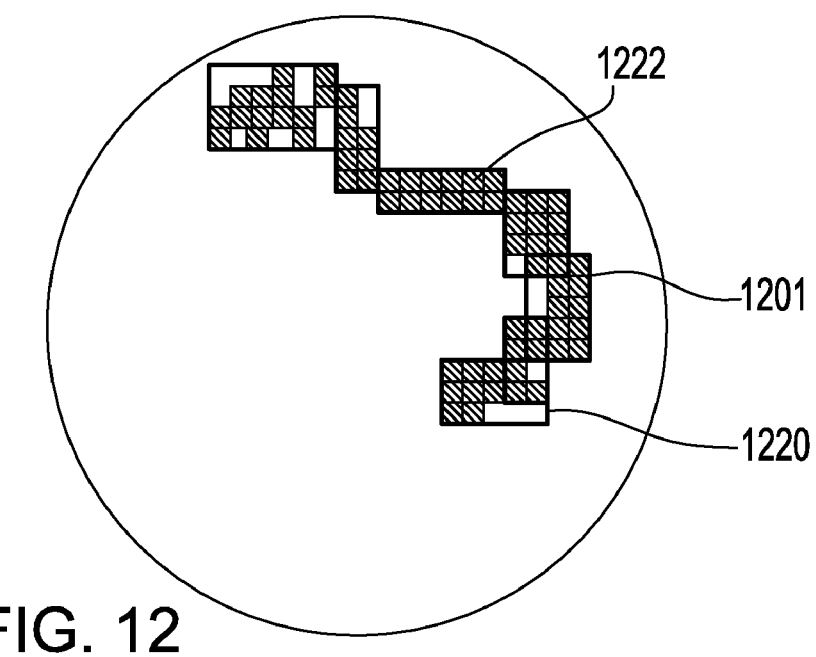
FIG. 12 shows an illustrative example of a rectilinear polygonal source with a limited number of rectangles based on a set of pixilated source points, including a rectilinear polygonal source consisting of seven smaller rectangles.

In another embodiment, the output rectilinear polygon is the bounding polygon for a set of pixilated source points generated by an SMO method. FIG. 12 shows an exemplary output of rectilinear polygonal source 1222 for the set of pixilated source points 1201. The solution is shown by numeral 1222 (FIG. 12) for the pixilated source points 1201. Rectilinear polygon 1222 is made of seven rectangles 1220 having the smallest area, and covering all the pixilated source points 1201.

Figure 1:
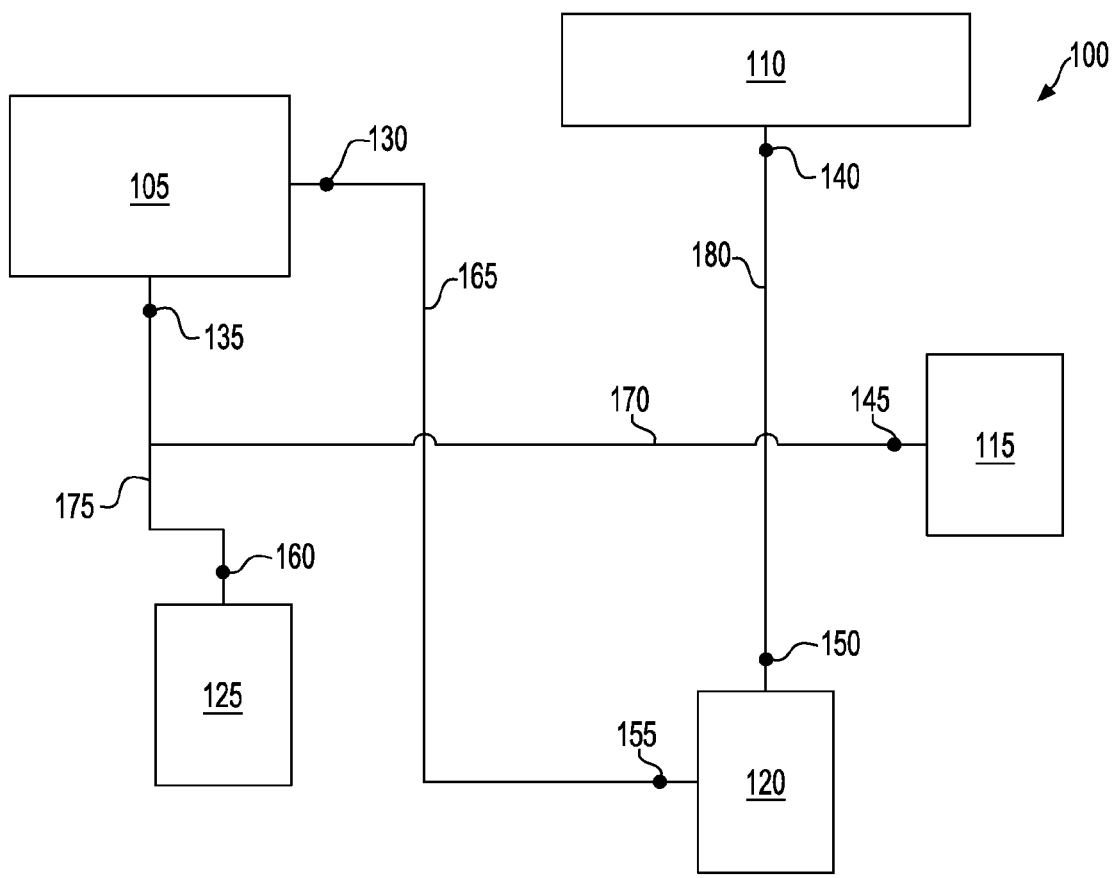
FIG. 1 is a block diagram showing an illustrative example of a conventional integrated circuit (IC) layout, showing a circuit module with a plurality of pins on multiple nets.
Figure 2A:
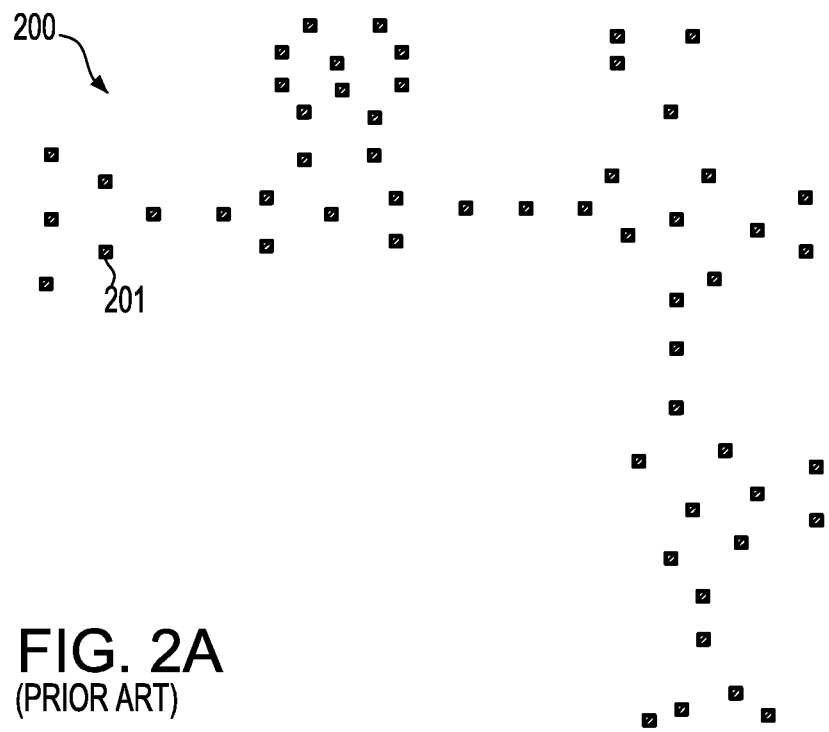
FIG. 2a shows prior art circuit components represented by a set of points.
Figure 2B:
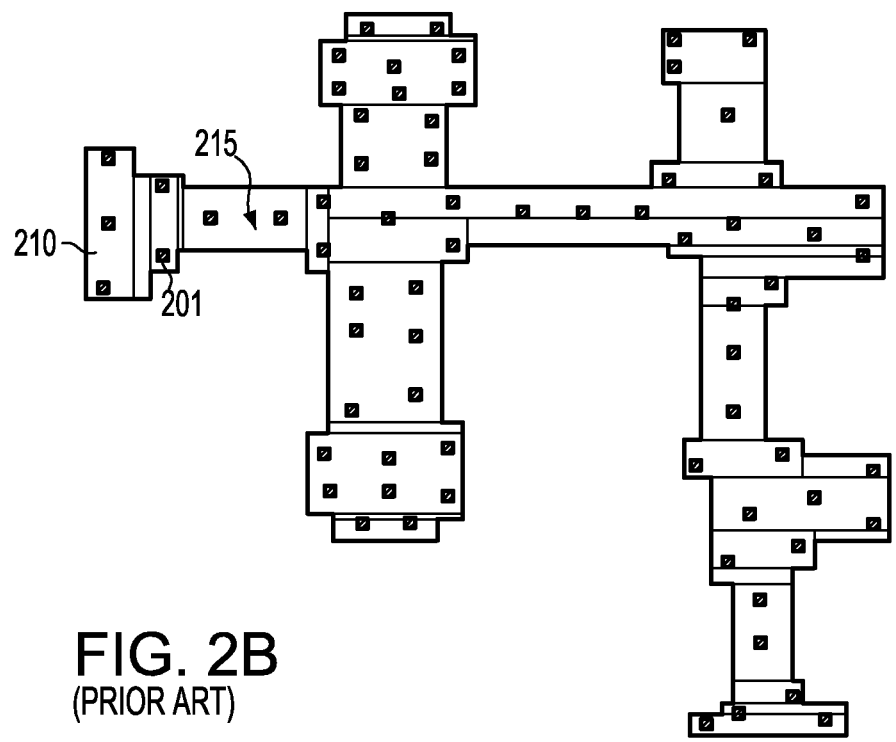
FIG. 2b shows an example of a prior art net based on the set of points shown in FIG. 2a consisting of a plurality of smaller rectangles.
Figure 3:
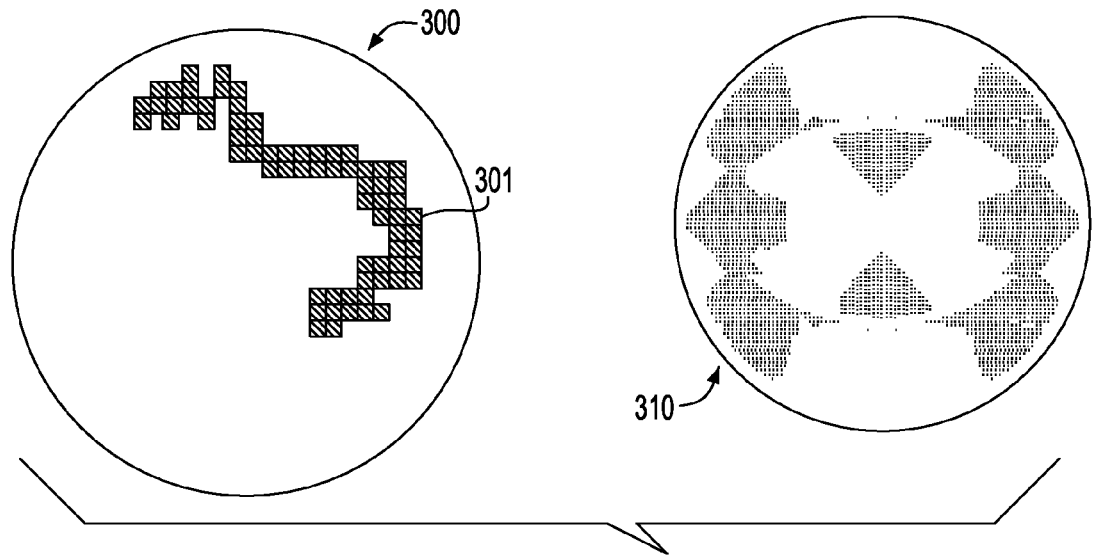
FIG. 3 shows an illustrative example of a prior art source following optimization within a turned-on pixel.
Figure 4A:
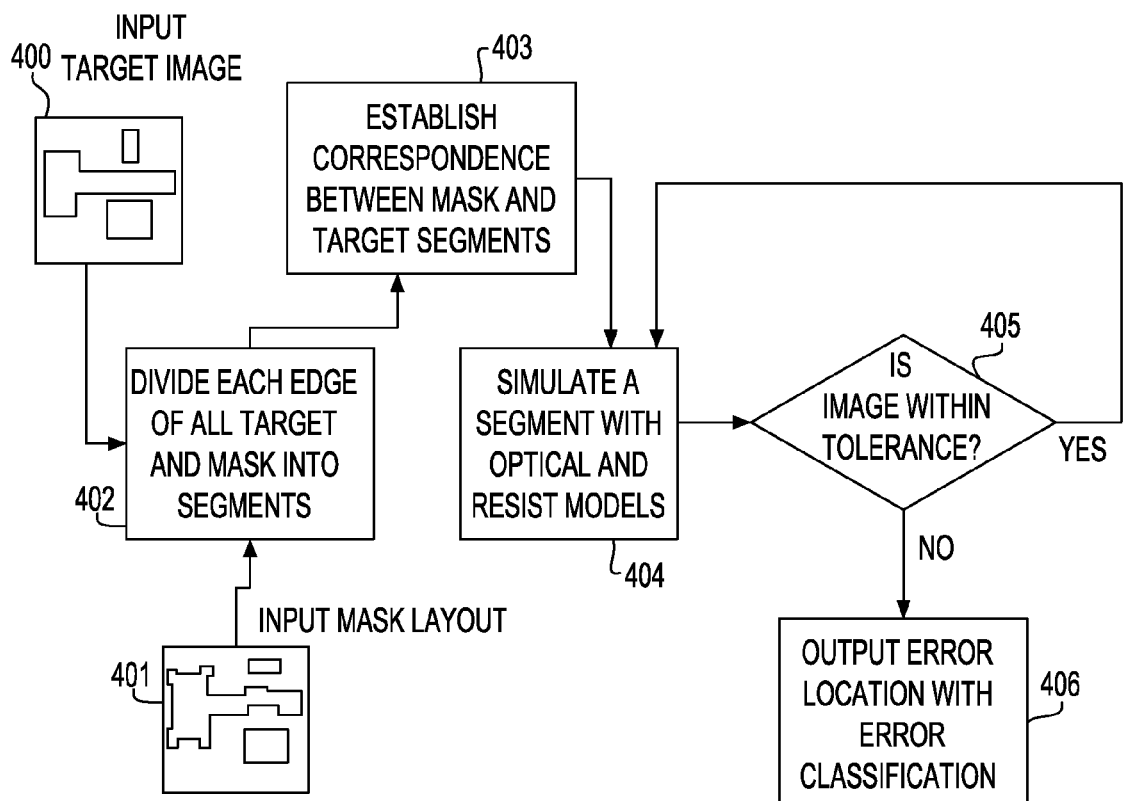
FIG. 4a illustrates a prior art chart showing an output error location with error classification used to simulate a mask layout image.
Figure 4B:
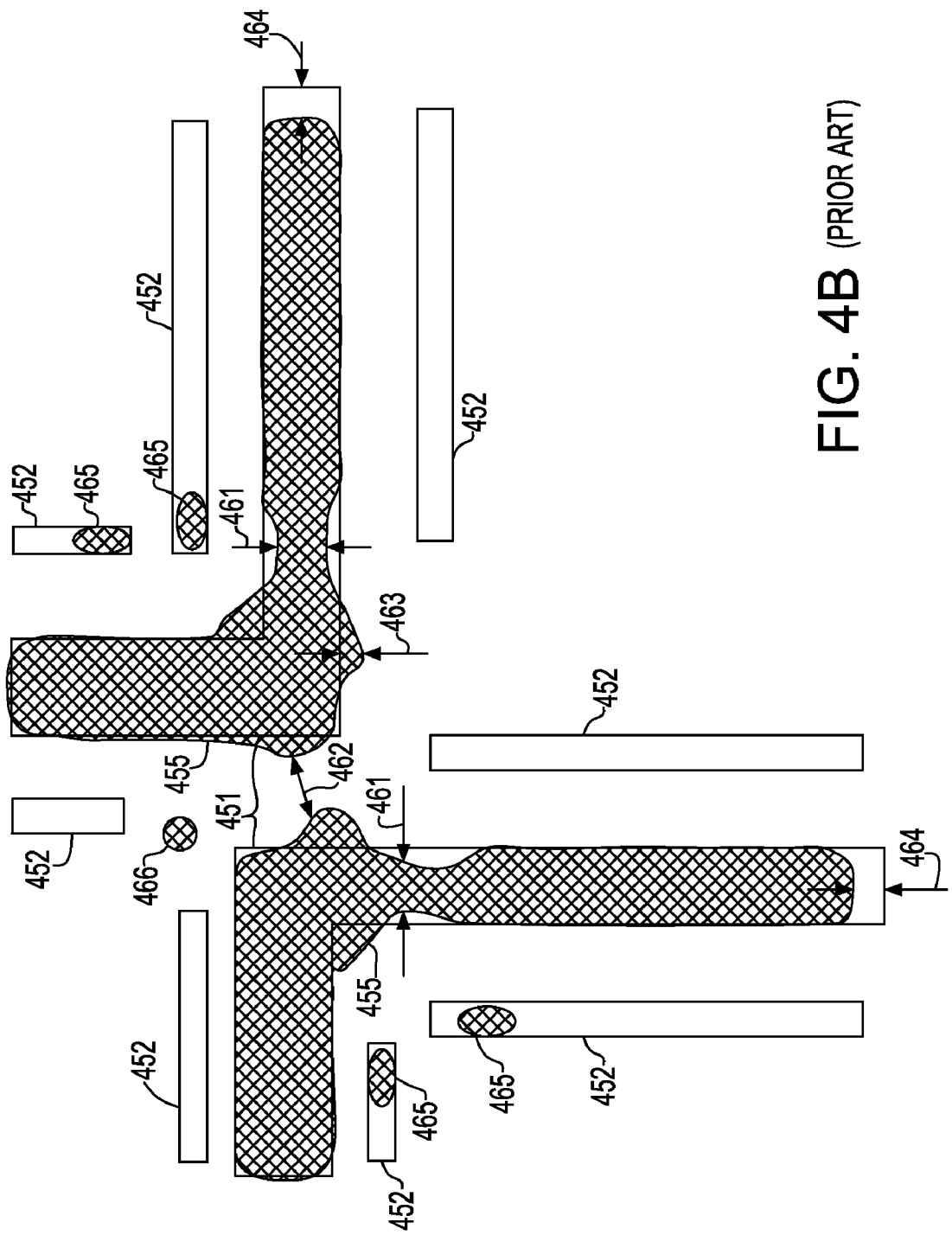
FIG. 4b is a schematic circuit diagram illustrating prior art mask layout shapes used for printing the main mask shapes, including various types of errors.
Figure 4C:
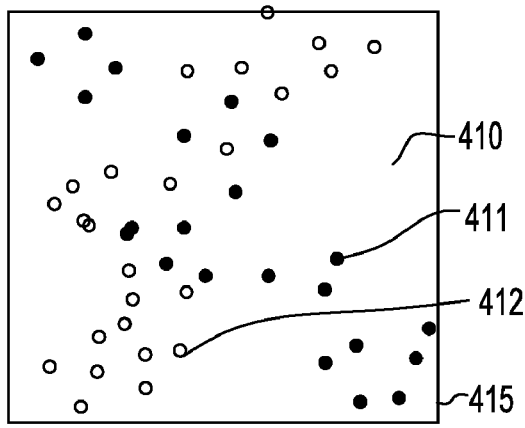
FIG. 4c shows an exemplary prior art ORC for localizing one type of errors within a cluster in which the group of error is bound within a bounding box.
Figure 13:
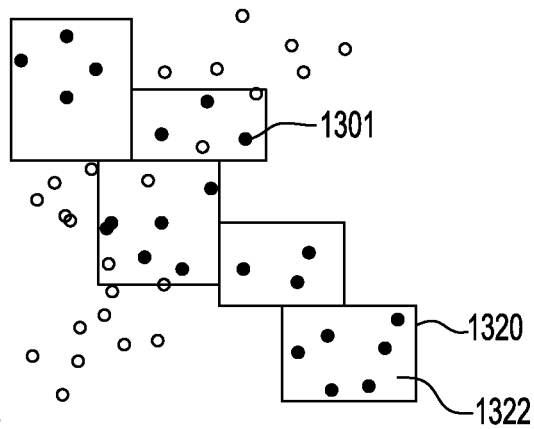
FIG. 13 shows an illustrative rectilinear polygonal cover tightly bounding the errors, in which the rectilinear polygonal cover consists of five smaller rectangles.

In still another embodiment, the output rectilinear polygon is the bounding polygon for a group of errors generated by a DRC or ORC method. FIG. 13 shows an exemplary output of rectilinear cover 1322 for the set of ORC or DRC errors shown in FIG. 4. The rectilinear polygon 1322 (FIG. 13) tightly bounds the errors 1301 by a rectilinear cover with the smallest area, and yet sufficiently simple to comprise only five rectangles 1320.

Figure 14:
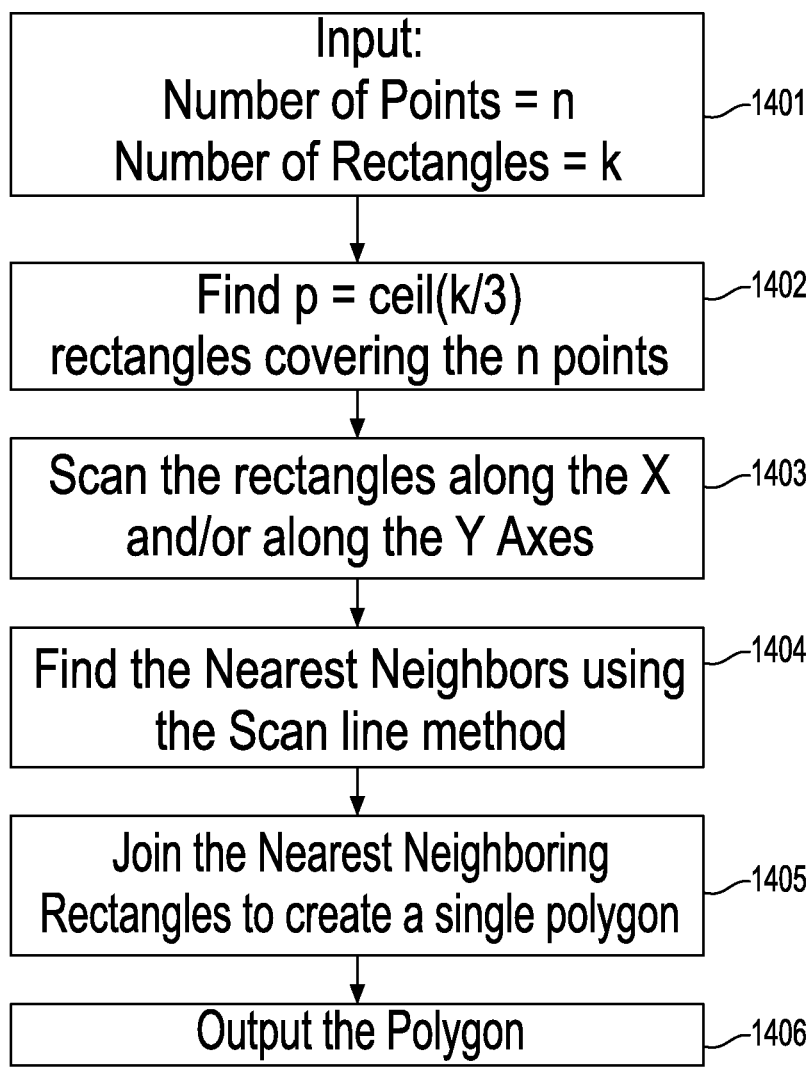
FIG. 14 is a flow chart illustrating another embodiment of the invention for the rectilinear polygon joined by a scan line method.

In yet another embodiment illustrated in FIG. 14, a flow chart is shown wherein a number n of points and a number k of rectangles are provided as inputs (1401). In step 1402, rectangles covering the n points are used to determine the aforementioned parameter p=ceil(k/3). The rectangles are scanned along the X and/or Y axes (1403). In Step 1404, the nearest neighbors are found using the nearest neighbor scan line method. In Step 1405, the nearest neighbors are joined to create a single polygon (1405). The rectilinear polygon is then outputted (1406). For illustrative purposes, the flow chart of FIG. 14 will be applied to an illustrative example based on FIGS. 15A-15D.

Figure 15A:
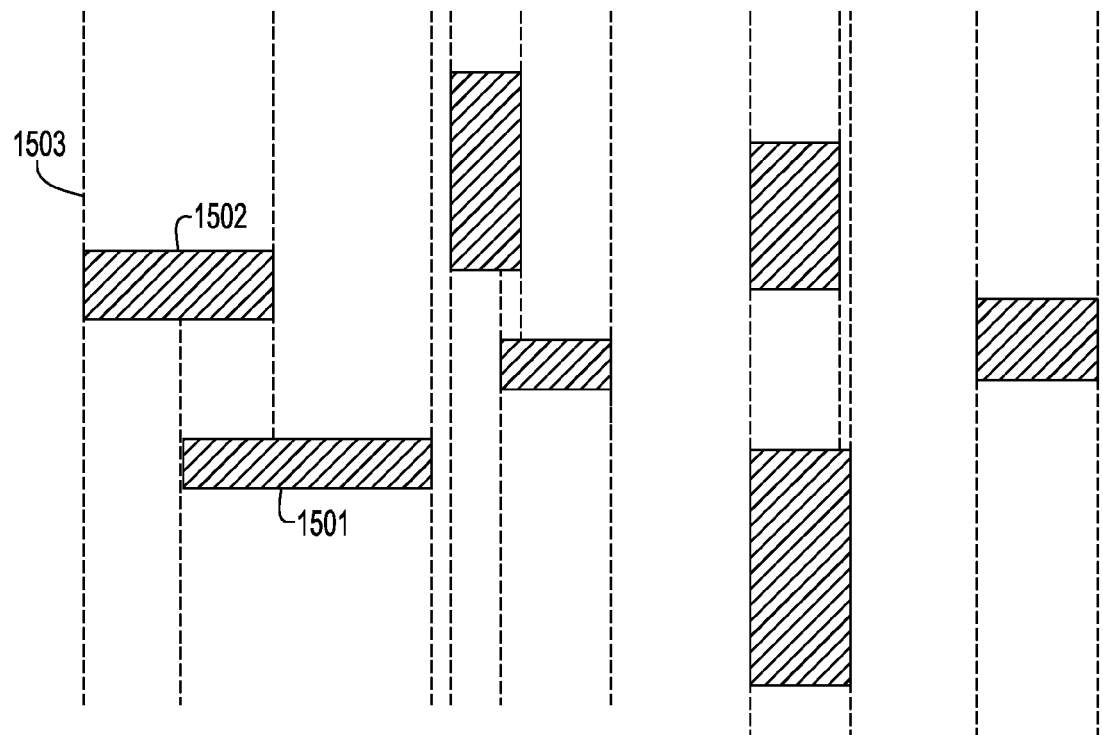
FIG. 15A depicts seven rectangles scanned by scan lines in accordance with the flow chart shown in FIG. 14.
Figure 15B:
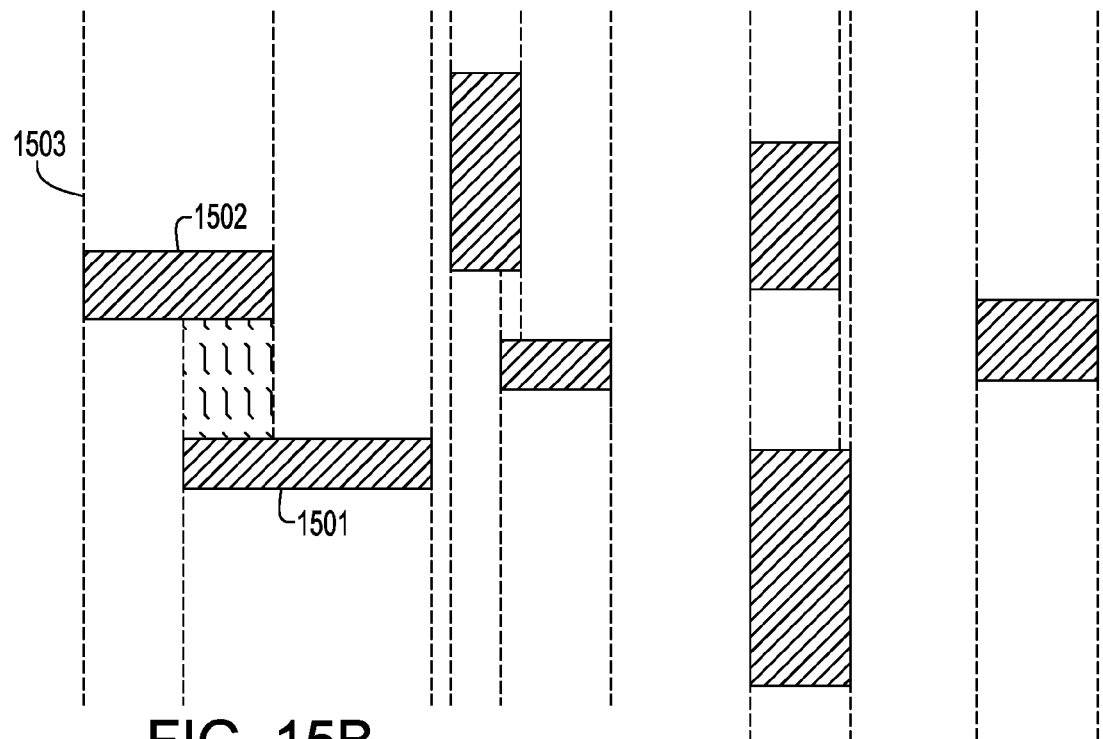
FIG. 15B shows two rectangles identified as being the nearest ones that are to be joined to form a single rectangle.
Figure 15C:
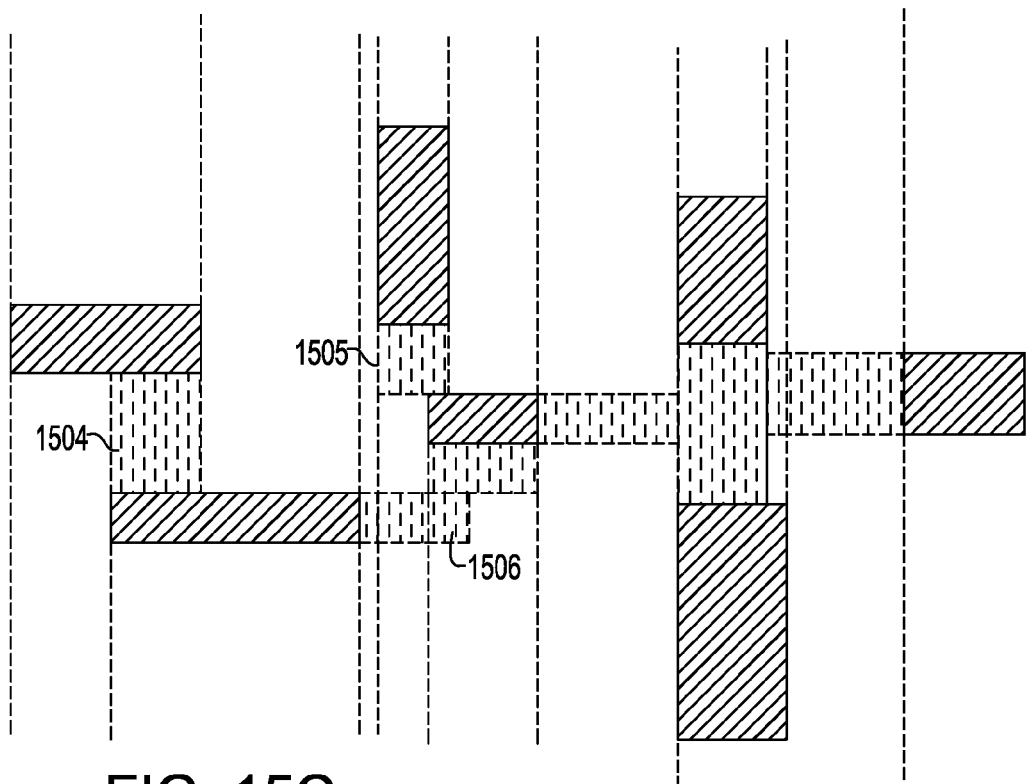
FIG. 15C shows the seven rectangles joined to one another.
Figure 15D:
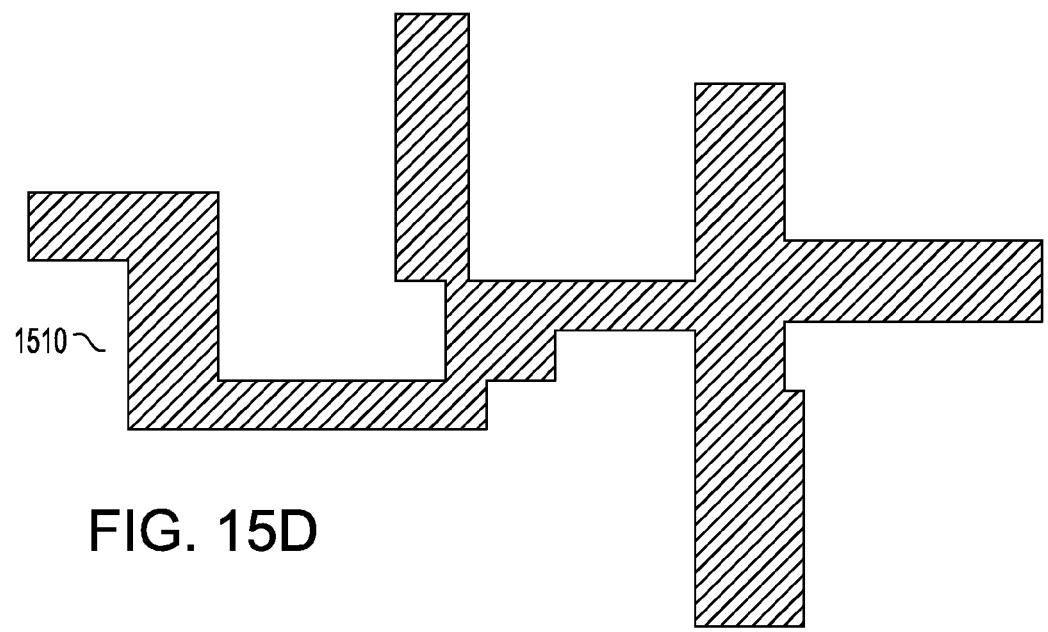
FIG. 15D illustrates the rectilinear polygon to be outputted.

The rectilinear polygons will now be shown, by jointly referring to FIG. 14 and FIGS. 15A-15D, to be joined by the scan line method. Steps 1401 and 1402 are the same as those described in steps 501 and 502 (FIG. 5). In Step 1403, the rectangles obtained in step 1402 are scanned either along the X or the Y axes (FIG. 15A), wherein seven rectangles are shown by rectangles 1501 and 1502. In FIG. 15A, the seven rectangles are scanned by scan lines 1503 in the X-direction. In step 1404 (FIG. 14), the nearest rectangles are determined in accordance to the scan lines used in step 1403. This is shown in FIG. 15B, where rectangles 1501 and 1502 are identified as being the nearest ones. In Step 1405 (FIG. 14), the nearest rectangles are joined to form a single rectangle, as depicted in FIGS. 15B and 15C. In FIG. 15B, rectangles 1501 and 1502 are joined by rectangle 1504, the joining being the same as the one described in step 505 (FIG. 5). In FIG. 15C, all the joining rectangles such as 1504, 1505, 1506 are shown among the seven rectangles. In step 1406, the rectilinear polygon is outputted, as shown by the rectilinear polygon 1510 (FIG. 15D).

The present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out the methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method for creating a rectilinear non-convex polygonal output representation of a component used in building of a Very Large Scale Integrated circuit (VLSI) chip from a plurality of points, each of the points representing a plurality of components, the method comprising:
   a) covering said plurality of points with a set of rectangles;
   b) finding the nearest rectangle for each rectangle forming said set, creating a Voronoi diagram applicable to said set of rectangles, forming a nearest neighbor tree for said Voronoi diagram, and finding in said nearest neighbor tree a nearest neighbor rectangle for each rectangle forming said set;
   c) creating a non-convex rectilinear polygon by connecting each rectangle to its nearest neighbor rectangle; and
   d) using a computer to apply said non-convex rectilinear polygon to build said VLSI chip.

2. The method of claim 1 wherein when finding the nearest rectangle, each rectangle from said set of rectangles further comprises:
   creating a scanline diagram for said set of rectangles; and
   finding the nearest neighbor rectangle for said set of rectangles based on said scanline diagram.

3. The method of claim 1 further comprising a maximum number k of rectangles defining said output rectilinear polygon, said output rectilinear polygon having the smallest area and being covered by said maximum number k of rectangles.

4. The method of claim 3 wherein said plurality of points are scanned horizontally and vertically, and wherein for each scan line, two rectangles are created, and selecting the pair of the rectangles having the smallest area.

5. The method of claim 4 wherein said rectangles are further subdivided into smaller area rectangles.

6. The method of claim 1 wherein said plurality of points represent a plurality of components represents terminals of said VLSI chip; and said rectilinear non-convex polygonal output is a netlist of said terminals.

7. The method of claim 1 wherein said plurality of points represents defects in said VLSI chip, and said rectilinear non-convex polygonal output is an area enclosing said defects.

8. The method of claim 2 wherein said defects are the output of a design rule checking program or an output of an optical rule checking program.

9. The method of claim 1 wherein said plurality of points are source pixels and said rectilinear non-convex polygonal output comprises a cover for said source pixels.

10. The method of claim 1 wherein said Voronoi diagram is partitioned into a plurality of regions.

11. The method of claim 10 wherein said Voronoi diagram is created for a set of a number p of rectangles defined as a tessellation of a two dimensional space region, wherein any point within the region i is closer to a rectangle i, for i=1, . . . , p than any other rectangle j, wherein i is different from j, and where j=1, . . . , p.

12. The method of claim 11 wherein said Voronoi diagram determines the nearest neighbor tree defined by a nearest neighbor graph, said nearest neighbor graph being a dual of said Voronoi diagram, and wherein adjacent regions are connected by an edge.

13. The method of claim 12, wherein said nearest neighbor tree is a minimum cost spanning tree of said nearest neighbor graph.

14. The method of claim 13, wherein said nearest neighbor graph is obtained from a minimum cost spanning tree algorithm.

15. The method of claim 14, wherein said nearest neighbor tree is created by joining said p rectangles.

16. The method of claim 13, wherein said rectangles are joined by extension, wherein rectangles to be considered for joining are selected from a branch of said nearest neighbor tree.

17. The method of claim 13, wherein said rectangles overlapping their respective x intervals, are joined by extending one of said rectangles along the y direction, and wherein any two rectangles to be joined, one is chosen to be extended by an extension having a smallest area.

18. The method of claim 13, wherein when two of said rectangles do not overlap in their x or y axes, they are joined by extending one of said rectangles along the x direction and another along the y direction.

19. A non-transitory program storage device readable by a machine, tangibly embodying a program of instructions executable by the machine to perform method steps for creating a rectilinear non-convex polygonal output representation of a component used for building a Very Large Scale Integrated Circuit (VLSI) chip from a plurality of points representative of a plurality of components of said VLSI chip, the method steps comprising:
 a) covering said plurality of points with a set of rectangles;
 b) finding the nearest rectangle for each rectangle forming said set, creating a Voronoi diagram applicable to said set of rectangles, forming a nearest neighbor tree for said Voronoi diagram, and finding in said nearest neighbor tree a nearest neighbor rectangle for each rectangle forming said set;
 c) creating a non-convex rectilinear polygon by connecting each rectangle to its nearest neighbor rectangle; and
 d) using a computer, applying said non-convex rectilinear polygon to build said VLSI chip.

* * * * *